US012765171B2

(12) United States Patent
Liu et al.

(10) Patent No.: US 12,765,171 B2
(45) Date of Patent: Oct. 13, 2026

(54) DISPLAY PANEL AND DISPLAY DEVICE

(71) Applicant: KUNSHAN GO-VISIONOX OPTO-ELECTRONICS CO., LTD., Kunshan (CN)

(72) Inventors: Yusheng Liu, Kunshan (CN); Gang Wang, Kunshan (CN); Liwei Ding, Kunshan (CN); Lei Mi, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 317 days.

(21) Appl. No.: 18/486,408

(22) Filed: Oct. 13, 2023

(65) Prior Publication Data

US 2024/0040832 A1 Feb. 1, 2024

Related U.S. Application Data

(63) Continuation of application No. PCT/CN2022/107403, filed on Jul. 22, 2022.

(30) Foreign Application Priority Data

Jan. 28, 2022 (CN) ......................... 202210108272.8

(51) Int. Cl.
*H10K 59/121* (2023.01)
*G09G 3/3233* (2016.01)
*H10K 59/131* (2023.01)

(52) U.S. Cl.
CPC ......... *H10K 59/121* (2023.02); *G09G 3/3233* (2013.01); *H10K 59/131* (2023.02);
(Continued)

(58) Field of Classification Search
CPC ............... H10K 59/121; H10K 59/131; H10K 59/80516; H10K 59/12; H10K 59/123;
(Continued)

(56) References Cited

U.S. PATENT DOCUMENTS

2019/0035874 A1* 1/2019 Han ..................... G09G 3/3233
2019/0138783 A1 5/2019 Yang et al.
(Continued)

FOREIGN PATENT DOCUMENTS

CN 106782416 A 5/2017
CN 109063631 A 12/2018
(Continued)

OTHER PUBLICATIONS

Extended Search Report issued on May 27, 2024, in corresponding European Application No. 22923212.9, 11 pages.
(Continued)

*Primary Examiner* — Yara B Green
*Assistant Examiner* — Akhee Sarker-Nag
(74) *Attorney, Agent, or Firm* — Maier & Maier, PLLC

(57) ABSTRACT

A display panel and a display device. The display panel includes a substrate, light-emitting units arranged in array alignment, first pixel circuit units, and second pixel circuit units. The substrate includes an active area and a frame area at least partially surrounding the active area. The light-emitting units are located in the active area. Each light-emitting unit includes a first electrode. The first pixel circuit units are arranged in array alignment and located in the active area. Each first pixel circuit unit includes first pixel circuits. The first pixel circuits are arranged in array alignment. The second pixel circuit units are located in the active area. Each second pixel circuit unit includes second pixel circuits. The second pixel circuits are arranged in array alignment. A first arrangement gap is defined between any two adjacent first pixel circuit units.

17 Claims, 5 Drawing Sheets

(52) U.S. Cl.
CPC ............... *G09G 2300/0408* (2013.01); *G09G 2320/0223* (2013.01); *G09G 2320/0233* (2013.01)

(58) Field of Classification Search
CPC .. H10K 59/8051; H10K 77/10; G09G 3/3233; G09G 2300/0408; G09G 2320/0223; G09G 2320/0233; G09G 3/3225; G09G 2300/0426; H10D 86/441; H10D 86/60
See application file for complete search history.

(56) References Cited

U.S. PATENT DOCUMENTS

| | | | | |
|---|---|---|---|---|
| 2021/0066409 | A1 | 3/2021 | Fan | |
| 2021/0202638 | A1 | 7/2021 | Park et al. | |
| 2021/0351261 | A1 | 11/2021 | Kim et al. | |
| 2022/0028317 | A1 | 1/2022 | Kim et al. | |
| 2022/0028938 | A1* | 1/2022 | Zhao | H10K 59/131 |
| 2022/0028954 | A1* | 1/2022 | Li | H10K 59/126 |
| 2022/0199737 | A1* | 6/2022 | Wang | H10K 59/1213 |
| 2022/0199739 | A1* | 6/2022 | Du | G09G 3/3233 |
| 2023/0098206 | A1* | 3/2023 | Sun | H10H 29/10 345/690 |
| 2024/0038153 | A1 | 2/2024 | Yin et al. | |

FOREIGN PATENT DOCUMENTS

| | | | | |
|---|---|---|---|---|
| CN | 109410823 | A | | 3/2019 |
| CN | 109448566 | A | | 3/2019 |
| CN | 110504289 | A | | 11/2019 |
| CN | 106782416 | B | | 12/2019 |
| CN | 111445878 | A | | 7/2020 |
| CN | 112038373 | A | | 12/2020 |
| CN | 113327963 | A | | 8/2021 |
| CN | 113506539 | A | * | 10/2021 |
| CN | 113539130 | A | | 10/2021 |
| CN | 113644094 | A | | 11/2021 |
| CN | 113809112 | A | | 12/2021 |
| CN | 113823214 | A | * | 12/2021 |
| CN | 114299820 | A | | 4/2022 |
| CN | 114512499 | A | | 5/2022 |
| EP | 3944225 | A1 | | 1/2022 |
| WO | 2014069529 | A1 | | 5/2014 |
| WO | 2021217413 | A | | 11/2021 |
| WO | 2021253343 | A1 | | 12/2021 |

OTHER PUBLICATIONS

International Search Report mailed on Sep. 28, 2022, in corresponding International application No. PCT/CN2022/107403, 5 pages.
Written Opinion issued on Sep. 28, 2022, in corresponding International application No. PCT/CN2022/107403, 6 pages (partial English translation provided).
First Office Action issued on Feb. 11, 2023, in corresponding Chinese application No. 2022101082728, 23 pages.
Second Office Action issued on May 24, 2023, in corresponding Chinese application No. 2022101082728, 24 pages.
Decision of Rejection issued on Aug. 6, 2023, in corresponding Chinese application No. 2022101082728, 35 pages.
Office Action issued on Sep. 3, 2024, in corresponding Japanese Application No. 2023-566913, 7 pages.
Notice of Allowance issued on Apr. 17, 2026, in corresponding Korean Application No. 10-2023-7037278, 8 pages.
Office Action issued on Mar. 3, 2026, in corresponding Japanese Application No. 2023-566913, 6 pages.

* cited by examiner

DISPLAY PANEL AND DISPLAY DEVICE

CROSS-REFERENCE TO RELATED APPLICATIONS

This application is a continuation of international patent application No. PCT/CN2022/107403, filed on Jul. 22, 2022, which claims priority to Chinese Patent Application No. 202210108272.8, entitled "DISPLAY PANEL AND DISPLAY DEVICE" filed on Jan. 28, 2022. The contents of the above identified applications are hereby incorporated herein in their entireties by reference.

TECHNICAL FIELD

The present application relates to the field of display technology, and in particular to a display panel and a display device.

BACKGROUND

With the development of display technology, in order to maximize an active area in a limited space, a narrow-frame display technique has been proposed.

Usually, as limited by a layout of a driving circuit in a frame area, and the flexible screen may also be limited by bending process, the frame size of the display screen cannot be further reduced. As a result, a technique that places part of the driving circuit in the active area in order to reduce the frame size has appeared on the market. However, this induces change of pixel circuits in the active area, which thereby affects the display stability of the screen.

SUMMARY

In view of this, there is a need to provide a display panel and display device.

According to an aspect of the present application, a display panel is provided, including a substrate, a plurality of light-emitting units arranged in array alignment, a plurality of first pixel circuit units, and a plurality of second pixel circuit units. The substrate includes an active area and a frame area at least partially surrounding the active area. The plurality of light-emitting units are located in the active area. Each light-emitting unit includes a first electrode. The plurality of first pixel circuit units are arranged in array alignment and located in the active area. Each first pixel circuit unit includes a plurality of first pixel circuits. The plurality of first pixel circuits are arranged in array alignment, and at least one first pixel circuit is electrically connected to the first electrode of a corresponding light-emitting unit. The plurality of second pixel circuit units are located in the active area. Each second pixel circuit unit includes a plurality of second pixel circuits. The plurality of second pixel circuits are arranged in array alignment, and at least one second pixel circuit is electrically connected to the first electrode of a corresponding light-emitting unit. A first arrangement gap is defined between any two adjacent first pixel circuit units.

According to another aspect of the present application, a display device is provided, including the above-described display panel.

In the above-described display device, a plurality of first pixel circuits are arranged to form a regular layout of a plurality of first pixel circuit units, so that a distance between two adjacent first pixel circuits in each first pixel circuit unit decreases, and a distance between any two adjacent first pixel circuit units increases correspondingly. Thus, the increased distance can meet the requirement for placing other materials, thereby improving the display stability of the display panel.

DETAILED DESCRIPTION

Figure 1:
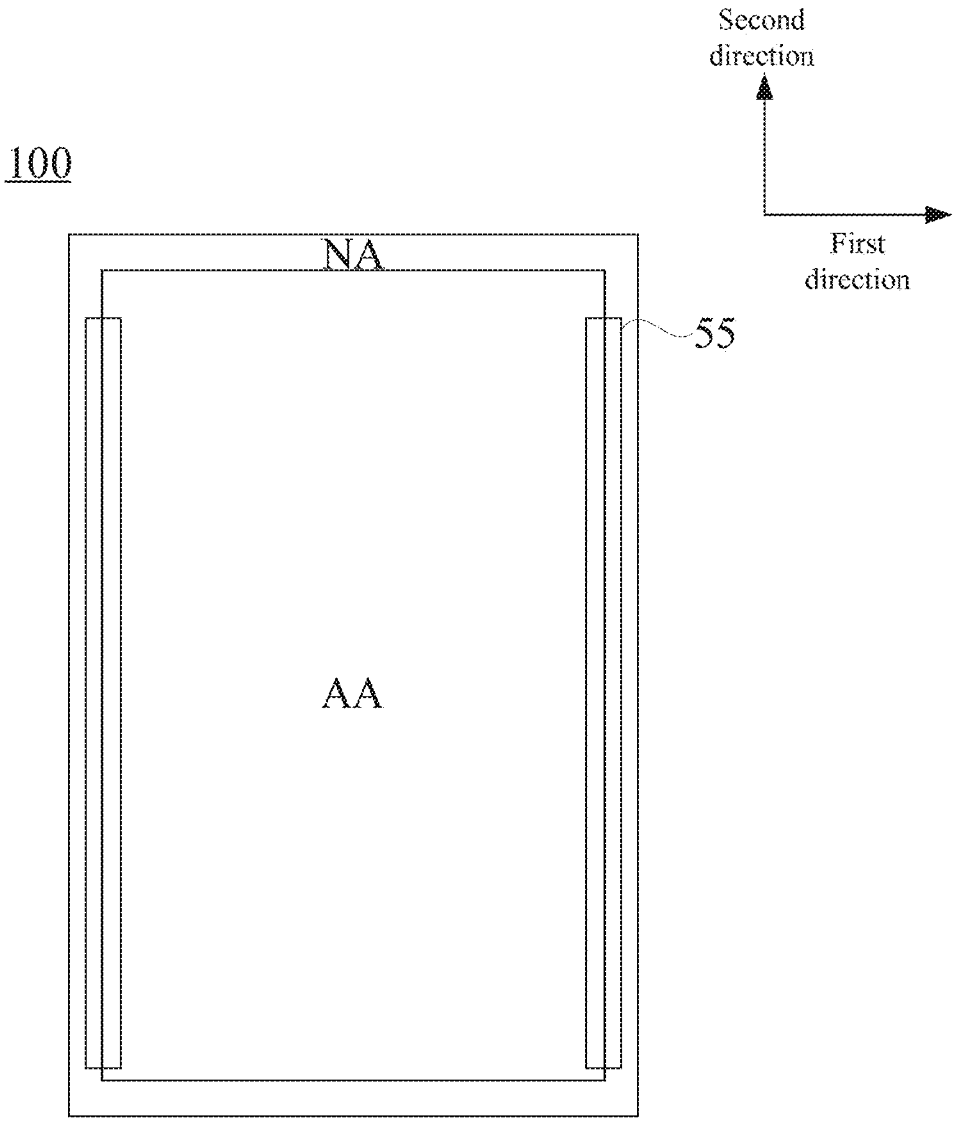
FIG. 1 is a schematic front view of a display panel in an embodiment of the present application.

In order to facilitate understanding of the present application, the present application will be described more thoroughly hereinafter with reference to the accompanying drawings. Embodiments of the present application are given in the accompanying drawings. However, the present application may be implemented in various different forms and is not limited to the embodiments described herein. The purpose of providing these embodiments is to provide a more thorough and complete understanding of the present application.

In the present application, a direction perpendicular to a display surface of a display panel is defined as a third direction, and two intersecting directions parallel to the display surface are defined as a first direction and a second direction. The third direction is also the thickness direction of the display panel and its substrate, and is also the direction from the substrate to the light-emitting unit.

In order to reduce the frame size, the driving circuit that is originally located in the frame area of the display panel can be partially located in an active area.

In the active area of the display panel, pixel circuits are electrically connected to light-emitting units to enable the light-emitting units to emit light. There is usually a one-to-one correspondence between the pixel circuits and the light-emitting units in the direction perpendicular to the display surface of the display panel, that is, the third direction. In order to place the driving circuit in the active area without affecting the size of the active area, the size of the pixel circuits can be reduced while the original size of the light-emitting units is maintained, so as to make room for placing the driving circuit under the area adjacent to the frame area, which can reduce the size of the frame area.

On this basis, it has been found through the inventors' study that although the space obtained by reducing the size of the pixel circuits in the active area can meet the requirements for placing the driving circuit in the active area, a distance between the corresponding two adjacent pixel circuits increases, which to some extent affects display stability. When all pixel circuits in the active area are distributed at equal intervals, although the distance between two adjacent pixel circuits increases, the increased distance is not enough for placing other materials or components, thereby failing to improve display stability.

Therefore, there is a need to provide a display panel and a display device, with improved display stability. Referring to FIGS. 1 to 4, in at least one embodiment of the present application, a display panel 100 includes a substrate 10, a plurality of light-emitting units 20, a plurality of first pixel circuit units 30, and a plurality of second pixel circuit units 40. The substrate 10 includes an active area AA and a frame area FA at least partially surrounding the active area. In display process, the display panel 100 can display images in the active area AA, while the frame area FA does not serve the function of displaying images.

The plurality of light-emitting units 20 are arranged in array alignment and located in the active area AA. Each light-emitting unit 20 includes a first electrode 21. Further, each light-emitting unit 20 also includes a light-emitting element 22 and a second electrode 23. In embodiments of the present application, the first electrode 21 is an anode, and the second electrode 23 is a cathode. The light-emitting element 22 can at least include an organic light-emitting layer. In an embodiment, the plurality of light-emitting units 20 are arranged in rows along the first direction, and arranged in columns along the second direction. In an embodiment, the first direction is perpendicular to the second direction.

The plurality of first pixel circuit units 30 are arranged in array alignment and located in the active area AA. Each first pixel circuit unit 30 includes a plurality of first pixel circuits 31. The plurality of first pixel circuits 31 are in array alignment, arranged in rows along the first direction, and arranged in columns along the second direction. Each first pixel circuit 31 is electrically connected to a corresponding light-emitting unit 20 to enable the corresponding light-emitting unit 20 to emit light. Specifically, at least one first pixel circuit 31 is electrically connected to the first electrode 21 of the corresponding light-emitting unit 20. The plurality of second pixel circuit units 40 are located in the active area AA. Each second pixel circuit unit 40 includes a plurality of second pixel circuits 41. The plurality of second pixel circuits 41 are in array alignment, arranged in rows along the first direction, and arranged in columns along the second direction. At least one second pixel circuit 41 is configured to be electrically connected to a corresponding light-emitting unit 20 to enable the corresponding light-emitting unit 20 to emit light. Specifically, at least one second pixel circuit 41 is electrically connected to the first electrode 21 of the corresponding light-emitting unit 20. In some embodiments, each light-emitting unit 20 in the plurality of light-emitting units 20 in the display panel 100 is configured to be electrically connected to one of the first pixel circuit 31 and the second pixel circuit 41. In some embodiments, the first pixel circuit units 30 and the second pixel circuits 41 are arranged side by side on the same plane perpendicular to the third direction, and the plurality of light-emitting units 20 as a whole are located above the first pixel circuit units 30 and the second pixel circuits 41.

Specifically, each of the first pixel circuits 31 and the second pixel circuits 41 includes a thin-film transistor. The thin-film transistor has a current output terminal, and the current output terminal is electrically connected to the first electrode 21 of the light-emitting unit 20. More specifically, the thin-film transistor in each of the first pixel circuits 31 and the second pixel circuits 41 includes a source electrode 311, a drain electrode 312, a gate electrode 313, and a semiconductor layer 314. The source electrode 311 and the drain electrode 312 are spaced from each other, and are respectively electrically connected to the semiconductor layer 314. The gate electrode 312 is opposite to the semiconductor layer 314 in the third direction and electrically insulated from the semiconductor layer 314. In some embodiments, the thin-film transistor is a P-type transistor, and the first electrode 21 of the light-emitting unit 20 is connected to the drain electrode 312. In other embodiments, the thin-film transistor is an N-type transistor, and the first electrode 21 of the light-emitting unit 20 is connected to the source electrode 311.

Figure 4:
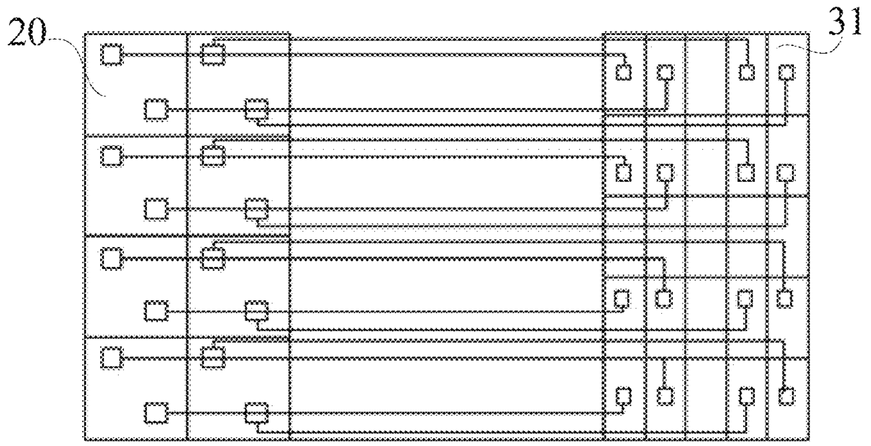
FIG. 4 is a schematic plan view of a connection between a light-emitting unit and a pixel circuit unit of a display panel in an embodiment of the present application.
Figure 5:
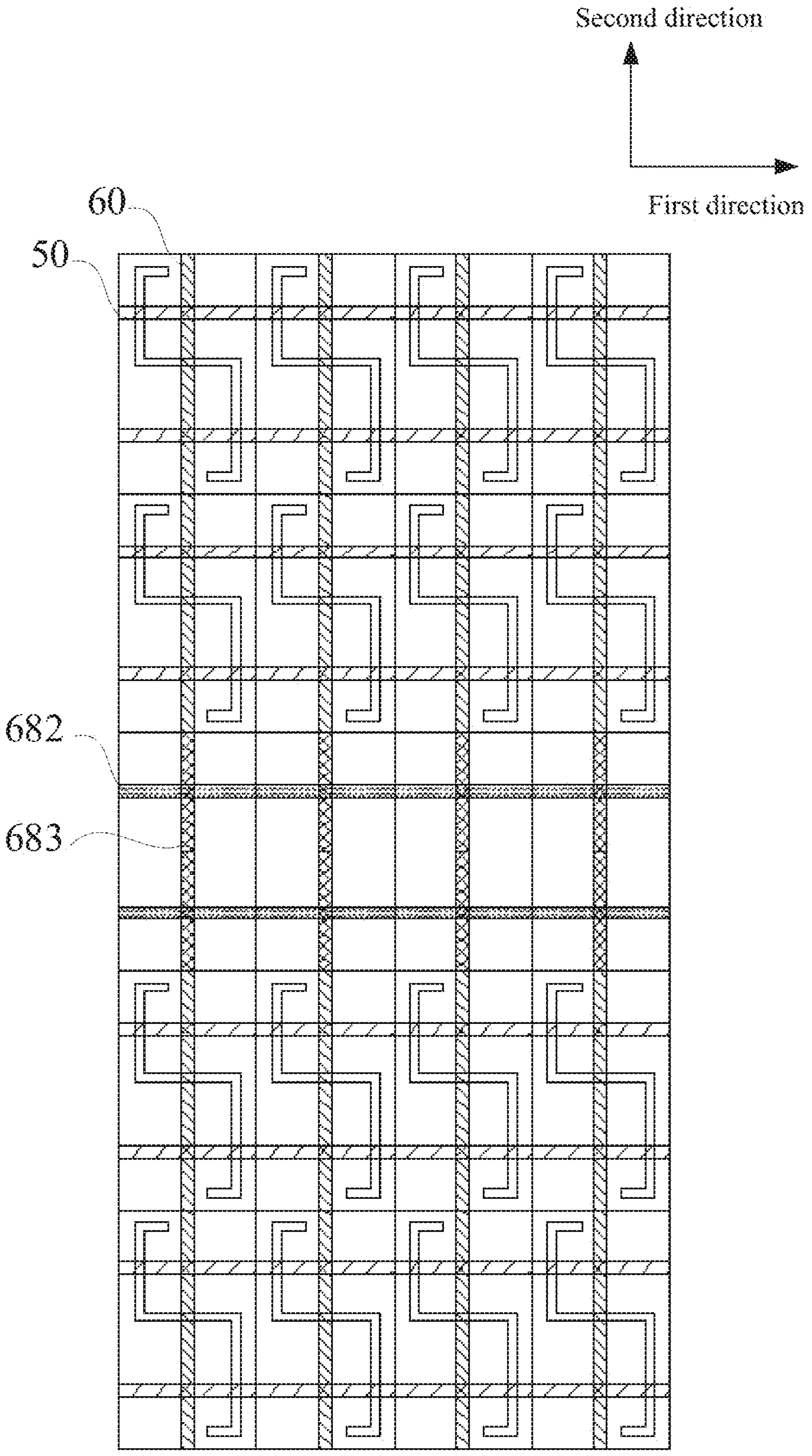
FIG. 5 is a schematic view of some lead wires in a display panel in an embodiment of the present application.

Referring also to FIG. 5, in embodiments of the present application, the display panel 100 further includes a plurality of gate lines 50 and a plurality of data lines 60 disposed on the substrate 10. Each gate line 50 extends along the first direction, and the plurality of gate lines 50 are arranged at intervals along the second direction. Each data line 60 extends along the second direction, and the plurality of data lines 60 are arranged at intervals along the first direction. The plurality of gate lines 50 intersect with the plurality of data lines 60 to define a plurality of pixel areas. Both the first direction and the second direction are parallel to the substrate 10. In an embodiment, the first direction is perpendicular to the second direction. Referring to FIG. 2 to FIG. 5, each first pixel circuit 31 is arranged in a corresponding pixel area. Each second pixel circuit 41 is arranged in another corresponding pixel area.

In embodiments of the present application, the plurality of first pixel circuit units are arranged in array alignment, and a first arrangement gap CCI is defined between any two adjacent rows of first pixel circuit units 30 and/or between any two adjacent columns of first pixel circuit units 30. In an embodiment, the plurality of first pixel circuit units 30 are arranged in rows along the first direction, and arranged in columns along the second direction.

In embodiments of the present application, in the same first pixel circuit unit 30, the distance between the orthographic projections of any two adjacent first pixel circuits 31 on the substrate 10 is smaller than the size of the first arrangement gap CC1. In this way, it is beneficial to make the display panel 100 have a relatively large size of the first arrangement gap CC1.

It can be understood that when two pixel circuits are adjacent in the first direction, the size of the arrangement gap between the two pixel circuits is the size of the arrangement gap in the first direction. When two pixel circuits are adjacent in the second direction, the size of the arrangement gap between the two pixel circuits is the size of the arrangement gap in the second direction. That is to say, the pixel circuits in the display panel 100 are not all distributed at equal intervals, and the distance between two adjacent first pixel circuits 31 located in different first pixel circuit units 30 is greater than the distance between two adjacent first pixel circuits 31 located in the same first pixel circuit unit 30.

In some embodiments, all first pixel circuits 31 located in the same first pixel circuit unit 30 are distributed at equal intervals.

In the present application, the plurality of first pixel circuits 31 are arranged to form a regular layout of the plurality of first pixel circuit units 30, so that the distance between two adjacent first pixel circuits 31 in each first pixel circuit unit 30 decreases, while the distance between any two adjacent rows and/or columns of first pixel circuit units 30 (namely the first arrangement gap CC1) correspondingly increases. This increased distance can be used to place other materials or components, such as a virtual pixel circuit, etc., thereby improving display stability of the display panel 100.

In embodiments of the present application, the orthographic projection of each first pixel circuit unit 30 on the substrate 10 forms a first projection area BB1, the orthographic projections of the first electrodes 21 of the plurality of light-emitting units 20 corresponding to the first pixel circuit unit 30 on the substrate 10 form second projection areas, and the second projection areas are located in the first projection area BB1. The first projection area BB1 includes the area of the orthographic projection of the gap between two adjacent first pixel circuits 31 on the substrate 10.

The orthographic projection of each second pixel circuit unit 40 on the substrate 10 forms a third projection area BB2, the orthographic projections of the first electrodes 21 of the plurality of light-emitting units 20 corresponding to the second pixel circuit unit 40 on the substrate 10 form fourth projection areas, and the fourth projection areas do not overlap or only partially overlap with the third projection area BB2. The third projection area BB2 includes the area of the orthographic projection of the gap between two adjacent second pixel circuits 41 on the substrate 10.

When the size of the pixel circuits is reduced, the connection wires between the pixel circuits and the corresponding light-emitting units are changed. When a large number of connection wires are changed, the circuit making process may become complicated and may affect the display stability.

In embodiments of the present application, since the second projection areas are located in the first projection area BB1, the positions of the first pixel circuits 31 in the first pixel circuit unit 30 relative to the corresponding light-emitting units 20 after the size of the first pixel circuits 31 is reduced can be kept substantially the same as those before the size of the first pixel circuits 31 is reduced, and thus there is no need to change the connection wires. In some embodiments, the position of the first pixel circuit 31 can be substantially in correspondence, in the third direction, with the position of the light-emitting unit 20 electrically connected thereto. For example, the orthographic projection of the first pixel circuit 31 on the substrate 10 at least partially overlaps with the orthographic projection of the corresponding light-emitting unit 20 on substrate 10. In contrast, the fourth projection areas do not overlap or only partially overlap with the third projection area BB2, so that the positions of the second pixel circuits 41 in the second pixel circuit unit 40 relative to the corresponding light-emitting units 20 after the size of the second pixel circuits 41 is reduced are not kept substantially the same as those before the size of the second pixel circuits 41 is reduced , and thus the connection wires have to be changed to meet the requirement for reducing the size of the pixel circuits to achieve a narrow frame. In some embodiments, the positions of at least part of the second pixel circuits 41 are not in correspondence, in the third direction, with the positions of the light-emitting units 20 electrically connected thereto. For example, the orthographic projections of at least part of the plurality of second pixel circuits 41 on the substrate 10 do not overlap at all with the orthographic projections of the corresponding light-emitting units 20 on substrate 10. In the display panel 100 of embodiments of the present application, the pixel circuits are divided into the first pixel circuits 31 forming the first pixel circuit units 30 and the second pixel circuits 41 forming the second pixel circuit units 40, and the pixel circuits that are in need to change the connection wires are limited to the second pixel circuit units 40, which reduces the number of connection wires to be changed, and thus simplifies the wire making process, thereby improving display stability.

As the size of each first pixel circuit 31 is reduced, the distance between two adjacent first pixel circuits 31 has to be reduced in order to concentrate multiple first pixel circuits 31 into one first pixel circuit unit 30. Therefore, while two adjacent first pixel circuits 31 of reduced size are brought closer to each other, there will be a slight deviation in position correspondence in the third direction between at least part or all of the first pixel circuits 31 and the corresponding light-emitting units 20, but the slight deviation is within a controllable range.

Referring to FIG. 3 again, in some embodiments, since the size and layout of the light-emitting units 20 do not change while reducing the size of the pixel circuits and changing the distance between adjacent pixel circuits, the light-emitting units 20 can be in misalignment in the third direction with the current output terminals of the second pixel circuits 41. In some embodiments, the display panel 100 further includes transitional metal layers 65 located between the plurality of second pixel circuits 41 and the first electrodes 21 of the corresponding light-emitting units 20. At least some of the second pixel circuits 41 are respectively electrically connected to the first electrodes 21 of the corresponding light-emitting units 20 through the transitional metal layers 65. Specifically, the transitional metal layers 65 are located between a planarization layer 78 and a source and drain electrode layer 73. More specifically, the transitional metal layers 65 are connected to the source and drain electrode layer 73 via through holes in a passivation layer 76.

In an embodiment, the active area AA includes a first active area AA1 and a second active area AA2 located between the first active area AA1 and the frame area FA. The plurality of first pixel circuit units 30 are located in the first active area AA1, and the plurality of second pixel circuit units 40 are located in the second active area AA2. In order to reduce the frame size, a driving circuit 55 is partially disposed in the active area, such as the second active area AA2, and is located at the edge of the active area AA. The position of the second pixel circuit unit 40 is more adjacent to the frame area FA than the position of the first pixel circuit unit 30 is, so that the change of the relative position of the pixel circuits and the light-emitting units 20 caused by this can be limited to the second pixel circuit unit 40 as much as possible, and then the first placement spaces CC1 can be formed regularly between the first pixel circuit units 30.

Further, the display panel 100 includes a driving circuit 55. The driving circuit 55 is disposed on the substrate 10, and at least part of the driving circuit 55 is disposed in the active area AA, such as the second active area AA2. The driving circuit 55 can be electrically connected to the first pixel circuits 31 and the second pixel circuits 41 to provide driving signals. Specifically, the driving circuit 55 includes a switch circuit, a gate electrode driving circuit, and a light-emitting control circuit.

The switch circuit is electrically connected to the first pixel circuits 31 and the second pixel circuits 41 through the data lines 60. Specifically, each data line 60 is electrically connected to all first pixel circuits 31 or all second pixel circuits 41 in a corresponding same column.

The gate electrode driving circuit is electrically connected to the first pixel circuits 31 and the second pixel circuits 41 through scanning lines in the gate lines 50, and is configured to provide gate electrode driving signals. Specifically, each gate line 50 is electrically connected to all first pixel circuits 31 or all second pixel circuits 41 in a corresponding same row.

The light-emitting control circuit can also be electrically connected to the first pixel circuits 31 and the second pixel circuits 41 through light-emitting control lines in the gate lines 50 to provide light-emitting signals. Specifically, a light-emitting control circuit and a gate electrode driving circuit are distributed along the second direction on opposite sides of a gate line 50.

The pixel circuits are configured to transmit data signals from the data lines 60 to the light-emitting units 20 in response to the gate electrode driving signals from the gate lines 50, so as to control light emission of each light-emitting unit 20, or to control brightness of each light-emitting unit 20.

In some embodiments, the orthographic projection of the driving circuit 55 located in the active area AA on the substrate 10 forms a fifth projection area. The fifth projection area is located on the side of the third projection area BB2 away from the first projection area BB1, and partially overlaps with the fourth projection areas. In this way, the driving circuit 55 can be confined under the light-emitting units 20 in the active area AA adjacent to the edge of the frame area FA, thereby reducing the size of the frame.

In some embodiments, the display panel 100 further includes a power line. The power line is electrically connected to at least one of the first pixel circuits 31, the second pixel circuits 41, or the light-emitting units 20 to provide voltage signals.

The power line of the present application can be arranged in the active area AA or the frame area FA. In some embodiments, the power line can include at least one of a first power line, a second power line, or a third power line. The first power line is configured to provide a low voltage signal (VDD), the second power line is configured to provide a high voltage signal (VSS), and the third power line is configured to provide a reference voltage signal (Vref). Specifically, the first power line VDD is electrically connected to the first pixel circuits 31 and the second pixel circuits 41 in the active area AA to apply voltage to the first electrodes 21 of the light-emitting units 20. The second power line VSS is electrically connected to the second electrodes 23 of the light-emitting units 20 in the frame area FA to apply voltage to the second electrodes 23. The third power line Vref is electrically connected to the first pixel circuits 31 and the second pixel circuits 41 in the active area AA.

Figure 2:
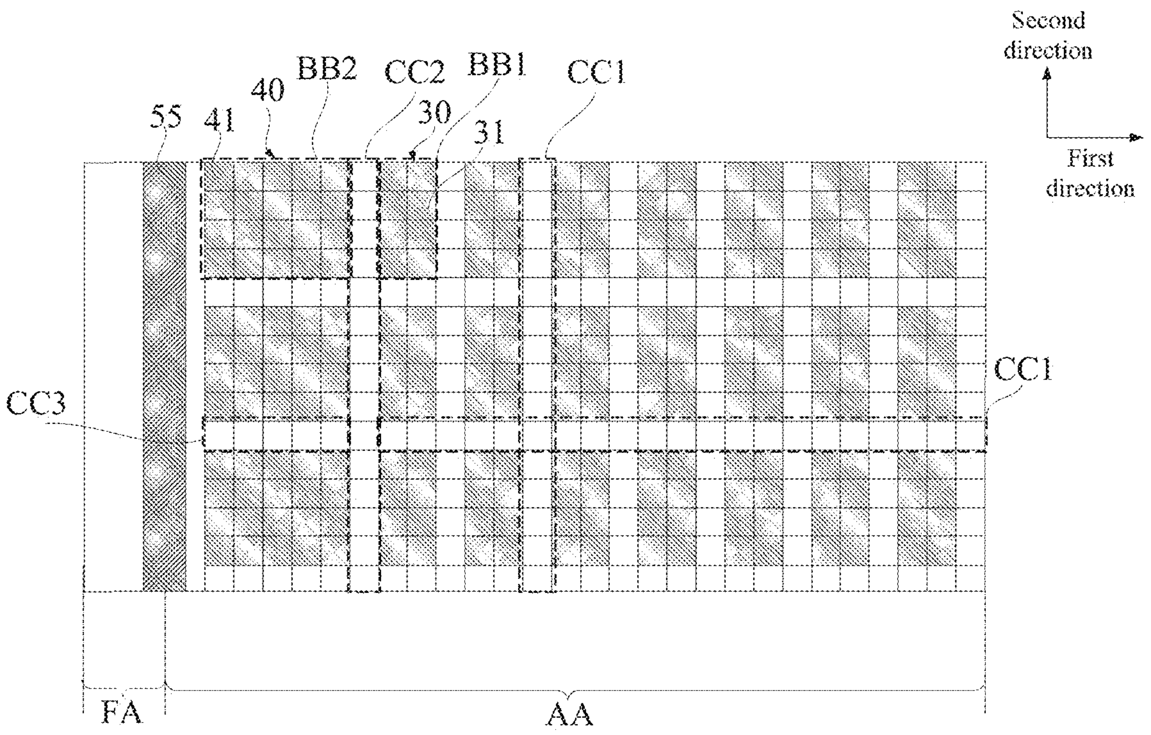
FIG. 2 is a schematic front view of a part of a structure of a display panel in an embodiment of the present application.
Figure 3:
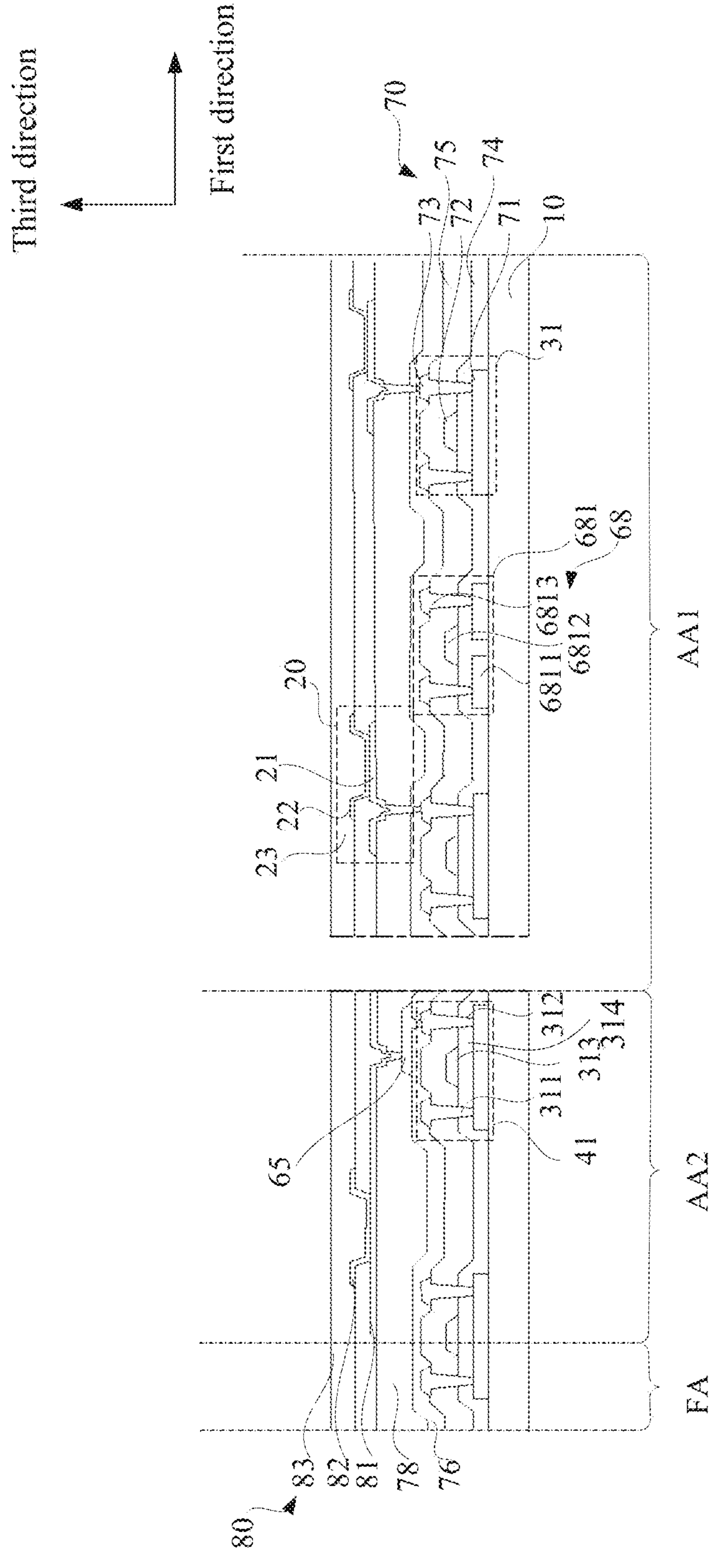
FIG. 3 is a schematic cross-sectional view of a part of a structure of a display panel in an embodiment of the present application.

Referring to FIG. 2 and FIG. 3 again, in some embodiments, the display panel 100 further includes first virtual pixel circuits 68. The first virtual pixel circuits 68 are located in the active area AA, and are specifically located in the first arrangement gaps CC1. The first virtual pixel circuits 68, the first pixel circuit units 30, and the second pixel circuit units 40 are located in the same layer. The first virtual pixel circuits 68 are electrically connected to the power line. Specifically, the first virtual pixel circuits 68 can be electrically connected to at least one or any combination of the first power line VDD, the second power line VSS, and the third power line Vref in the power line. When electrically connected with any combination thereof, the connections can be made according to certain rules.

In this way, by having the first virtual pixel circuits 68 connected to the power line, the transmission lines are increased to compensate for a significant voltage drop (IR Drop) generated on the relatively long power line, so that voltages on the first pixel circuits 31 and the second pixel circuits 41 are consistent, and thus the driving currents provided to the respective light-emitting units 20 are consistent, so that the luminous brightness of the display panel 100 is uniform, thereby improving display uniformity of the display panel 100. In addition, the first virtual pixel circuits 68 can be entirely disposed in the first arrangement gaps CC1, which can simplify their connection with the power line.

As shown in FIG. 4, the plurality of light-emitting units 20 can be in forms of equal sized small squares and arranged in 4 rows and 2 columns, and plurality of first pixel circuits 31 in the corresponding first pixel circuit unit 30 can be also in forms of equal sized small squares and arranged in 5 rows and 2.5 columns. Therefore, the extra 1 row and 0.5 columns in the first pixel circuit unit 30 is the area where the first virtual pixel circuit 68 can be placed.

Referring to FIG. 3 again, in some embodiments, the first virtual pixel circuit 68 includes a plurality of first virtual sub-pixel circuits 681 connected to each other. The pattern and shape of the first virtual sub-pixel circuit 681 are consistent with the pattern and shape of the first pixel circuit 31 or the second pixel circuit 41. In this way, the first virtual sub-pixel circuits 681 can be formed synchronously with the first pixel circuits 31 or the second pixel circuits 41, thus reducing the manufacturing difficulty of the first virtual pixel circuit 68 and simplifying the process flow of the display panel 100. In addition, defects such as bright or dark marks (Mura) and optical stripes caused by differences in circuit design can be avoided in the active area AA.

Specifically, the first virtual sub-pixel circuit 681 can include a non-metal layer 6811, a first metal layer 6812, and a second metal layer 6813 stacked along the third direction.

More specifically, the display panel 100 can include an array layer 70, a passivation layer 76, a planarization layer 78, and a light-emitting element layer 80 sequentially stacked on the substrate 10 along the third direction. The array layer 70 includes an active layer 71, a gate electrode layer 72, and a source and drain electrode layer 73. The array layer 70 further includes a first insulating layer 74 disposed between the active layer 71 and the gate electrode layer 72, and includes a second insulating layer 75 disposed between the gate electrode layer 72 and the source and drain electrode layer 73. The light-emitting element layer 80 includes a first electrode layer 81, a light-emitting layer 82, and a second electrode layer 83. The source and drain electrode layer 73 forms the source electrodes 311 and the drain electrodes 312 of the thin-film transistors of the first pixel circuits 31 and the second pixel circuits 41. The active layer 71 forms the semiconductor layers 314 of the thin-film transistors of the first pixel circuits 31 and the second pixel circuits 41. The gate electrode layer 72 forms the gate electrodes 313 of the thin-film transistors of the first pixel circuits 31 and the second pixel circuits 41. The first electrode layer 81 forms the first electrodes 21 of the light-emitting units 20. The light-emitting layer 82 forms the light-emitting elements 22 of the light-emitting units 20. The second electrode layer 83 forms the second electrodes 23 of the light-emitting units 20.

The non-metal layer 6811 is located in the same layer as the active layer 71, and the pattern and shape of the non-metal layer 6811 are respectively the same as those of the first pixel circuit 31 or the second pixel circuit 41 in the active layer 71. In some embodiments, the non-metal layer 6811 includes a virtual semiconductor layer, which is located in the same layer and has the same pattern and shape respectively as the semiconductor layers 314 of the thin-film transistors of the first pixel circuits 31 and the second pixel circuits 41. The first metal layer 6812 is located in the same layer as the gate electrode layer 72, and the pattern and shape of the first metal layer 6812 are respectively the same as those of the first pixel circuits 31 and the second pixel circuits 41 in the gate electrode layer 72. In some embodiments, the first metal layer 6812 includes a virtual gate electrode, which is located in the same layer and has the same pattern and shape as the gate electrodes 313 of the thin-film transistors of the first pixel circuits 31 and the second pixel circuits 41. The second metal layer 6813 is located in the same layer as the source and drain electrode layer 73, and the pattern and shape of the second metal layer 6813 are respectively the same as those of the first pixel circuits 31 and the second pixel circuits 41 in the source and drain electrode layer 73. In some embodiments, the second metal layer 6813 can include a virtual source electrode and a virtual drain electrode, which are respectively located in the same layer and have the same pattern and shape as the source electrodes 311 and the drain electrodes 312 of the thin-film transistors of the first pixel circuits 31 and the second pixel circuits 41.

In some embodiments, the non-metal layer 6811, the first metal layer 6812, and the second metal layer 6813 are connected to each other along the third direction. Specifically, they can be connected by through holes formed in the first insulating layer 74 and the second insulating layer 75. In other embodiments, alternatively, the non-metal layer 6811 can be connected to the first metal layer 6812, or the first metal layer 6812 can be connected to the second metal layer 6813, or the non-metal layer 6811 can be connected to the second metal layer 6813.

In some embodiments, the first virtual sub-pixel circuit 681 can include only one or any combination of the non-metal layer 6811, the first metal layer 6812, or the second metal layer 6813, which is not limited herein.

Since the first virtual pixel circuit 68 does not need to serve the function of driving the light-emitting unit 20, the first virtual pixel circuit 681 is not electrically connected to any light-emitting unit 20. In some embodiments, separation can be made to the non-metal layer 6811, separating it into two independent and mutually insulated parts. For example, the virtual semiconductor layer can be separated into two independent and mutually insulated parts. The two independent and mutually insulated parts can be respectively connected to the virtual source electrode and the virtual drain electrode of the second metal layer 6813 through the through holes in the first insulating layer 74 and the second insulating layer 75.

In other embodiments, at least one of the virtual source electrode and the virtual drain electrode of the second metal layer 6813 can be disconnected from the non-metal layer 6811, specifically, by canceling the corresponding through hole in the first insulating layer 74 or the second insulating layer 75.

As shown in FIG. 5, in some embodiments, at least part of the wiring of the first virtual pixel circuit 68 is in grid form. Specifically, at least part of the wiring of the first virtual pixel circuit 68 is in consistent with the gate lines 50 and the data lines 60. In this way, the voltage drop can be reduced, and the display effect can be optimized. Specifically, the first virtual pixel circuit 68 includes a plurality of first metal lead wires 682 parallel to the gate lines and a plurality of second metal lead wires 683 parallel to the data lines 60. The plurality of first metal lead wires 682 intersect with the plurality of second metal lead wires 683 to form a grid structure. More specifically, the first metal lead wires 682 are parallel to the second direction, and the second metal lead wires 683 are parallel to the first direction.

In an embodiment, the first metal lead wires 682 extend in the same direction as the gate lines 50, and the second metal lead wires 683 extend in the same direction as the data line Since the first metal lead wires 682 and second metal lead wires 683 are to be electrically connected to the power line, rather than the signal sources of the gate lines 50 and data lines in order to distinguish the two, the first metal lead wires 682 and the second metal lead wires 683 can be located in layers different from the layers of the gate lines 50 and the data lines 60.

In some embodiments, the first metal lead wire 682 includes one selected from the first metal layers 6812 and the second metal layers 6813, and the second metal lead wire 683 includes the other one selected from the first metal layers 6812 and the second metal layers 6813. Specifically, each first metal lead wire 682 can be formed by sequentially connecting one of the plurality of first metal layers 6812 and the plurality of second metal layers 6813 aligned along the first direction in a row, and each second metal lead wire 683 can be formed by sequentially connecting the other one of the plurality of second metal layers 6813 or the plurality of first metal layers 6812 aligned along the second direction in a column.

In some embodiments, the first arrangement gap CC1 of the display panel 100 includes a first arrangement sub-gap located between two first pixel circuit units 30 adjacent along the first direction, and a second arrangement sub-gap located between two first pixel circuit units 30 adjacent along the second direction. The size of the first arrangement sub-gap is different from the size of the second arrangement sub-gap. The difference in the gaps can meet wiring requirements of different sizes, quantities, or shapes.

In some embodiments, a second arrangement gap CC2 is defined between adjacent first pixel circuit unit 30 and second pixel circuit unit 40. By having the second arrangement gap CC2, the gap between the first pixel circuit unit 30 and the second pixel circuit unit 40 can also be used to place other materials, thereby improving display stability of the display panel 100. In an embodiment, the size of the first arrangement gap CC1 is equal to the size of the second arrangement gap CC2. In this way, the size of the gap between the pixel circuit units in the entire display panel can be kept consistent, which is beneficial to optimize the display effect.

Referring to FIG. 2 again, in some embodiments, the display panel 100 further includes a second virtual pixel circuit. The second virtual pixel circuit is disposed between two adjacent second pixel circuit units 40 and is electrically connected to the power line.

In an embodiment, the plurality of second pixel circuit units 40 are located on one side of the plurality of first pixel circuit units 30 in the first direction, and the plurality of second pixel circuit units 40 are arranged in a column along the second direction. A third arrangement gap CC3 is defined between any two second pixel circuit units 40 adjacent in the second direction. All the first arrangement gaps CC1 between any two adjacent columns of first pixel circuit units 30 are in communication with each other, and are in communication with the corresponding third arrangement gap CC3. Further, the second virtual pixel circuit is disposed in the third arrangement gap CC3.

In some other embodiments, the plurality of second pixel circuit units 40 are located on one side of the plurality of first pixel circuit units 30 in the second direction, and the plurality of second pixel circuit units 40 are arranged in a row along the first direction. A fourth arrangement gap is defined between any two second pixel circuit units 40 adjacent in the first direction. All the first arrangement gaps CC1 between any two adjacent rows of first pixel circuit units 30 are in communication with each other, and are in communication with the corresponding fourth arrangement gap. Further, the second virtual pixel circuit is disposed in the fourth arrangement gap CC4.

In other embodiments, the arrangement of the plurality of second pixel circuit units can be a combination of the above two embodiments. The display panel 100 not only includes the second pixel circuit units 40 arranged in a column along the second direction, but also includes the second pixel circuit units 40 arranged in a row along the first direction, which is not limited herein. In this way, it can be avoided that the first arrangement gaps CC1, the third arrangement gaps CC3, and the fourth arrangement gaps are in complicated communications which make the first virtual pixel circuits 68 and the second virtual pixel circuits connected complicatedly, resulting in complicated wiring.

Of course, in other embodiments, the plurality of second pixel circuit units 40 can be arranged continuously, and the third arrangement gap CC3 or the fourth arrangement gap defined between two adjacent second pixel circuit units 40 can be canceled, which is not limited herein.

In the same second pixel circuit unit 40, the distance between the orthographic projections of any two adjacent second pixel circuits 41 on the substrate 10 is smaller than the size of the third arrangement gap CC3 or the fourth arrangement gap.

Furthermore, the first virtual pixel circuit 68 and the second virtual pixel circuit can be connected at the connecting location between the first arrangement gap CC1 and the third arrangement gap CC3 or the fourth arrangement gap. In this way, since the end of the power line is located in a binding area of the frame area FA, the wiring of the first virtual pixel circuit 68 can be avoided from being interfered by the gathered second pixel circuit unit 40, as the third arrangement gap CC3 or the fourth arrangement gap is formed between two adjacent second pixel circuit units 40, and the second virtual pixel circuit is electrically connected to the first virtual pixel circuit 68 at the connecting location between the third arrangement gap CC3 or the fourth arrangement gap and the first arrangement gap CC1. Therefore, the wiring of the second virtual pixel circuit can reach the frame area FA without the need of bypassing the gathered second pixel circuit unit 40, which is simplified.

In some embodiments, the second virtual pixel circuit includes a plurality of second virtual sub-pixel circuits connected to each other. The structure, form, film or layer arrangement, and connection relationship with other components of the second virtual sub-pixel circuit can all be the same with those of the first virtual pixel circuit and will not be repeated herein.

Based on the same inventive concept, an embodiment of the present application further provides a display device, including the above-described display panel 100.

Specifically, the display device can be applied to the fields such as mobile terminals, bionic electronics, electronic skins, wearable devices, vehicle-mounted devices, internet of things devices, and artificial intelligence devices. Specifically, the display terminal can be a digital device such as a mobile phone, a tablet, a handheld computer, an ipod, or a smart watch.

Not all possible combinations of the technical features in the above embodiments are described. However, in the case that there is no contradiction in the combination of these technical features, these combinations should be considered to be within the scope of the present application.

What is claimed is:

1. A display panel, comprising:

a substrate, comprising an active area and a frame area at least partially surrounding the active area;

a plurality of light-emitting units, arranged in array alignment and located in the active area, each of the light-emitting units comprising a first electrode;

a plurality of first pixel circuit units, arranged in array alignment and located in the active area, each of the first pixel circuit units comprising a plurality of first pixel circuits, the plurality of first pixel circuits being arranged in array alignment, and at least one of the first pixel circuits being electrically connected to the first electrode of a corresponding light-emitting unit; and a plurality of second pixel circuit units, located in the active area, each of the second pixel circuit units comprising a plurality of second pixel circuits, the plurality of second pixel circuits being arranged in array alignment, and at least one of the second pixel circuits being electrically connected to the first electrode of a corresponding light-emitting unit;

wherein a first arrangement gap is defined between two adjacent first pixel circuit units;

wherein in a same first pixel circuit unit, a distance between orthographic projections of two adjacent first pixel circuits on the substrate is smaller than a width of the first arrangement gap;

wherein an orthographic projection of each first pixel circuit unit on the substrate forms a first projection area, and orthographic projections of the first electrodes of the plurality of light-emitting units corresponding to the first pixel circuit unit on the substrate form second projection areas; the second projection areas are entirely located in the first projection area.

2. The display panel according to claim 1, wherein a second arrangement gap is defined between adjacent first pixel circuit unit and second pixel circuit unit, and a size of the first arrangement gap is equal to a size of the second arrangement gap.

3. The display panel according to claim 1, wherein the plurality of first pixel circuit units are arranged in rows along the first direction, and arranged in columns along the second direction;

the first arrangement gap of the display panel comprises a first arrangement sub-gap located between two columns of first pixel circuit units adjacent along the first direction, and a second arrangement sub-gap located between two rows of first pixel circuit units adjacent along the second direction;

a size of the first arrangement sub-gap is different from a size of the second arrangement sub-gap; and both the first direction and the second direction are parallel to a display surface of the substrate, and the first direction and the second direction are perpendicular to each other.

4. The display panel according to claim 1, wherein the active area comprises a first active area and a second active area located between the first active area and the frame area;

the plurality of first pixel circuit units are located in the first active area, and the plurality of second pixel circuit units are located in the second active area.

5. The display panel according to claim 1, wherein an orthographic projection of each second pixel circuit unit on the substrate forms a third projection area, and orthographic projections of the first electrodes of the plurality of light-emitting units corresponding to the second pixel circuit unit on the substrate form fourth projection areas, and the fourth projection areas partially overlap or do not overlap with the third projection area.

6. The display panel according to claim 5, further comprising a driving circuit, wherein the driving circuit is disposed on the substrate and at least partially located in the active area, the driving circuit is electrically connected to the plurality of first pixel circuits and the plurality of second pixel circuits to provide driving signals; and an orthographic projection of the driving circuit located in the active area on the substrate forms a fifth projection area, and the fifth projection area partially overlaps with the fourth projection area.

7. The display panel according to claim 5, further comprising transitional metal layers, wherein the transitional metal layers are located between the plurality of second pixel circuits and the first electrodes of the plurality of light-emitting units corresponding to the plurality of second pixel circuits, at least some of the plurality of second pixel circuits are respectively electrically connected to the first electrodes of the corresponding light-emitting units through the transitional metal layers.

8. The display panel according to claim 1, wherein the plurality of first pixel circuit units are arranged in rows along the first direction, and arranged in columns along the second direction;

the plurality of second pixel circuit units are located on one side of the plurality of first pixel circuit units in the first direction, and the plurality of second pixel circuit units are arranged in a column along the second direction; a third arrangement gap is defined between any two second pixel circuit units adjacent in the second direction; all first arrangement gaps between any two adjacent columns of first pixel circuit units are in communication with each other, and are in communication with the corresponding third arrangement gap; and both the first direction and the second direction are parallel to a display surface of the substrate, and the first direction is perpendicular to the second direction.

9. The display panel according to claim 1, wherein the plurality of first pixel circuit units are arranged in rows along the first direction, and arranged in columns along the second direction;

the plurality of second pixel circuit units are located on one side of the plurality of first pixel circuit units in the second direction, and the plurality of second pixel circuit units are arranged in a row along the first direction; a fourth arrangement gap is defined between any two second pixel circuit units adjacent in the first direction, and all first arrangement gaps between any two adjacent rows of first pixel circuit units are in communication with each other, and are in communication with the corresponding fourth arrangement gap;

both the first direction and the second direction are parallel to a display surface of the substrate, and the first direction is perpendicular to the second direction.

10. The display panel according to claim 1, wherein the plurality of first pixel circuit units are arranged in rows along the first direction, and arranged in columns along the second direction;

the plurality of second pixel circuit units are located on one side of the plurality of first pixel circuit units in the first direction, and the plurality of second pixel circuit units are arranged in a column along the second direction; a third arrangement gap is defined between any two second pixel circuit units adjacent in the second direction; all first arrangement gaps between any two adjacent columns of first pixel circuit units are in communication with each other, and are in communication with the corresponding third arrangement gap;

the plurality of second pixel circuit units are located on one side of the plurality of first pixel circuit units in the second direction, and the plurality of second pixel circuit units are arranged in a row along the first direction; a fourth arrangement gap is defined between any two second pixel circuit units adjacent in the first direction, and all first arrangement gaps between any two adjacent rows of first pixel circuit units are in communication with each other, and are in communication with the corresponding fourth arrangement gap; and both the first direction and the second direction are parallel to a display surface of the substrate, and the first direction is perpendicular to the second direction.

11. The display panel according to claim 1, wherein the display panel further comprises a power line and a first virtual pixel circuit, the power line is electrically connected to at least one of the first pixel circuits, the second pixel circuits, or the light-emitting units to provide voltage signals; the first virtual pixel circuit is located in the first arrangement gap and is electrically connected to the power line.

12. The display panel according to claim 11, wherein at least part of wiring of the first virtual pixel circuit is in grid form.

13. The display panel according to claim 11, wherein the power line is configured to provide at least one of a low voltage signal, a high voltage signal, and a reference voltage signal.

14. The display panel according to claim 11, wherein the first virtual pixel circuit comprises a plurality of first virtual sub-pixel circuits connected to each other, and a pattern and a shape of the first virtual sub-pixel circuits are consistent with a pattern and a shape of the first pixel circuits or the second pixel circuits.

15. The display panel according to claim 14, wherein the first virtual sub-pixel circuit comprises a non-metal layer, a first metal layer, and a second metal layer stacked along a third direction, at least two of the non-metal layer, the first metal layer, or the second metal layer are connected to each other along the third direction; and the third direction is a direction from the substrate to the plurality of light-emitting units.

16. A display device, comprising the display panel according to claim 1.

17. A display panel, comprising:

a substrate, comprising an active area and a frame area at least partially surrounding the active area;

a plurality of light-emitting units, arranged in array alignment and located in the active area, each of the light-emitting units comprising a first electrode;

a plurality of first pixel circuit units, arranged in array alignment and located in the active area, each of the first pixel circuit units comprising a plurality of first pixel circuits, the plurality of first pixel circuits being arranged in array alignment, and at least one of the first pixel circuits being electrically connected to the first electrode of a corresponding light-emitting unit; and a plurality of second pixel circuit units, located in the active area, each of the second pixel circuit units comprising a plurality of second pixel circuits, the plurality of second pixel circuits being arranged in array alignment, and at least one of the second pixel circuits being electrically connected to the first electrode of a corresponding light-emitting unit;

wherein a first arrangement gap is defined between two adjacent first pixel circuit units;

wherein the display panel further comprises a power line and a first virtual pixel circuit, the first virtual pixel circuit is located in the first arrangement gap and is electrically connected to the power line; the first virtual pixel circuit comprises a first virtual sub-pixel circuit, the first virtual sub-pixel circuit is not electrically connected to any light-emitting unit.

* * * * *